United States Patent
Xie et al.

(10) Patent No.: US 11,545,416 B2
(45) Date of Patent: Jan. 3, 2023

(54) MINIMIZATION OF INSERTION LOSS VARIATION IN THROUGH-SILICON VIAS (TSVS)

(71) Applicant: Intel Corporation, Santa Clara, CA (US)

(72) Inventors: Jianyong Xie, Chandler, AZ (US); Yidnekachew S. Mekonnen, Chandler, AZ (US); Zhiguo Qian, Chandler, AZ (US); Kemal Aygun, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 403 days.

(21) Appl. No.: 16/643,816

(22) PCT Filed: Sep. 30, 2017

(86) PCT No.: PCT/US2017/054669
§ 371 (c)(1),
(2) Date: Mar. 2, 2020

(87) PCT Pub. No.: WO2019/066985
PCT Pub. Date: Apr. 4, 2019

(65) Prior Publication Data
US 2020/0279793 A1    Sep. 3, 2020

(51) Int. Cl.
*H01L 23/48* (2006.01)
*H01L 23/498* (2006.01)
(Continued)

(52) U.S. Cl.
CPC ...... *H01L 23/481* (2013.01); *H01L 23/49816* (2013.01); *H01L 23/528* (2013.01);
(Continued)

(58) Field of Classification Search
CPC ............ H01L 23/481; H01L 23/49816; H01L 23/5227
See application file for complete search history.

(56) References Cited

U.S. PATENT DOCUMENTS

| 2011/0049676 A1* | 3/2011 | Ding | ..................... H01P 11/007 257/E29.325 |
|---|---|---|---|
| 2012/0175731 A1 | 7/2012 | Chen et al. | |
| 2014/0048908 A1 | 2/2014 | Chen et al. | |

OTHER PUBLICATIONS

Kim et al.; "Through silicon via (TSV) equalizer." Electrical Performance of Electronic Packaging and Systems, 2009. EPEPS '09. IEEE 18$^{th}$ Conference on, IEEE, Piscataway, NJ, USA. Oct. 19, 2009; pp. 13-16.

(Continued)

*Primary Examiner* — Errol V Fernandes
(74) *Attorney, Agent, or Firm* — Schwabe, Williamson & Wyatt, P.C.

(57) ABSTRACT

An electronic device package is described. The electronic device package includes one or more dies. The electronic device package includes an interposer coupled to the one or more dies. The electronic device package also includes a package substrate coupled to the interposer. The electronic device package includes a plurality of through-silicon vias (TSVs) in at least one die of the one or more dies, or the interposer, or both. The electronic device package includes a passive equalizer structure communicatively coupled to a TSV pair in the plurality of TSVs. The passive equalizer structure is operable to minimize a level of insertion loss variation in the TSV pair.

27 Claims, 8 Drawing Sheets

(51) Int. Cl.
  *H01L 23/522* (2006.01)
  *H01L 23/528* (2006.01)
  *H01L 23/538* (2006.01)
  *H01L 23/66* (2006.01)
  *H01L 23/00* (2006.01)
  *H01L 25/18* (2006.01)
  *H01L 25/00* (2006.01)

(52) U.S. Cl.
  CPC ...... *H01L 23/5227* (2013.01); *H01L 23/5228* (2013.01); *H01L 23/5384* (2013.01); *H01L 23/5385* (2013.01); *H01L 23/5386* (2013.01); *H01L 23/66* (2013.01); *H01L 24/16* (2013.01); *H01L 24/81* (2013.01); *H01L 25/18* (2013.01); *H01L 25/50* (2013.01); *H01L 24/17* (2013.01); *H01L 2223/6616* (2013.01); *H01L 2223/6638* (2013.01); *H01L 2224/16146* (2013.01); *H01L 2224/16225* (2013.01); *H01L 2224/17181* (2013.01); *H01L 2924/1431* (2013.01); *H01L 2924/1434* (2013.01)

(56) References Cited

OTHER PUBLICATIONS

PCT International Application No. PCT/US2017/054669, Filing date Sep. 30, 2017; Jianyong Xie, International Search Report dated date Jun. 26, 2018; 5 Pages.

Sun et al.; "Passive Equalizer Design for Through Silicon Vias with Perfect Compensation." IEEE Transaction on Components, Packaging and Manufacturing Technology, IEEE, USA, vol. 1, No. 11; Nov. 8, 2011; pp. 1815-1822.

\* cited by examiner

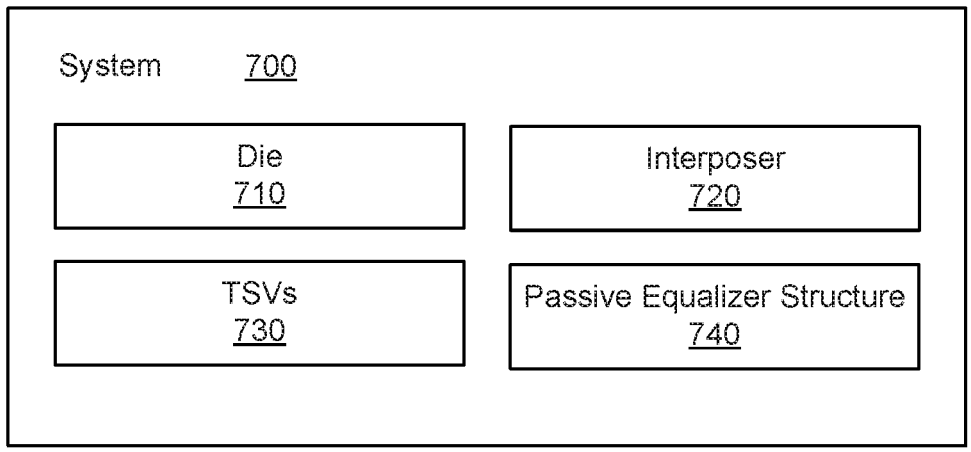
FIG. 7
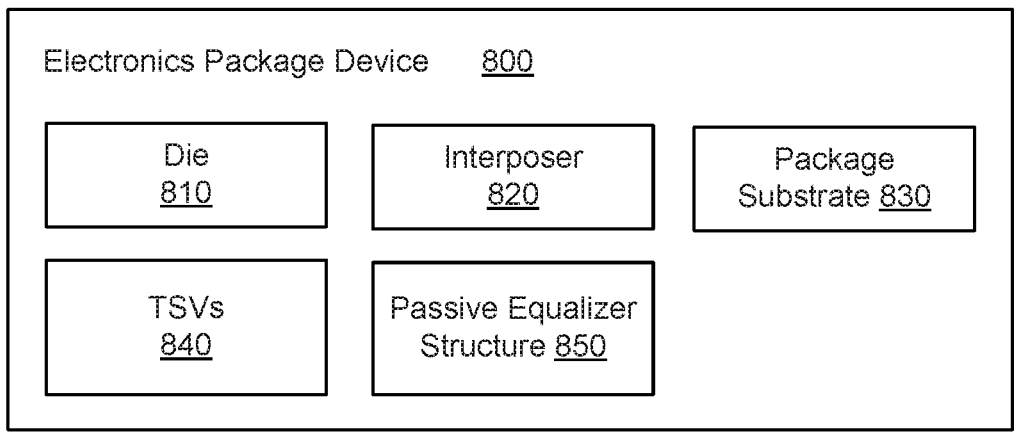
FIG. 8
900
Connecting a passive equalizer structure to a through-silicon vias (TSV) pair in the electronics packaging device, wherein the passive equalizer structure is operable to reduce a level of insertion loss variation in the TSV pair — 910
FIG. 9

MINIMIZATION OF INSERTION LOSS VARIATION IN THROUGH-SILICON VIAS (TSVS)

PRIORITY INFORMATION

This application is a 371 U.S. national stage entry of PCT Application Serial No. PCT/US2017/054669, filed Sep. 30, 2017, which is incorporated herein by reference in its entirety.

BACKGROUND

Integrated circuit packaging can include a stacked die configuration. For example, stacked dies can be electrically coupled to a package substrate. The stacked die configuration can provide a higher component density and has become increasingly popular for small form factor applications. For example, the stacked die configuration can be utilized in mobile phones, personal digital assistants (PDA), digital cameras, etc. The stacked dies can be connected to the package substrate by wire bond connections or using controlled collapse chip connections (C4) for flip chips, and the stacked dies can be offset from one another to provide clearance for the wire bond connections.

BRIEF DESCRIPTION OF THE DRAWINGS

Features and advantages of technology embodiments will be apparent from the detailed description which follows, taken in conjunction with the accompanying drawings, which together illustrate, by way of example, technology features; and, wherein:

FIG. 7 illustrates a system operable to minimize an insertion loss in accordance with an example embodiment;

FIG. 8 illustrates an electronic device package in accordance with an example embodiment;

FIG. 9 depicts a flowchart of a method for minimizing an insertion loss in an electronic device package in accordance with an example embodiment.

Figure 1:
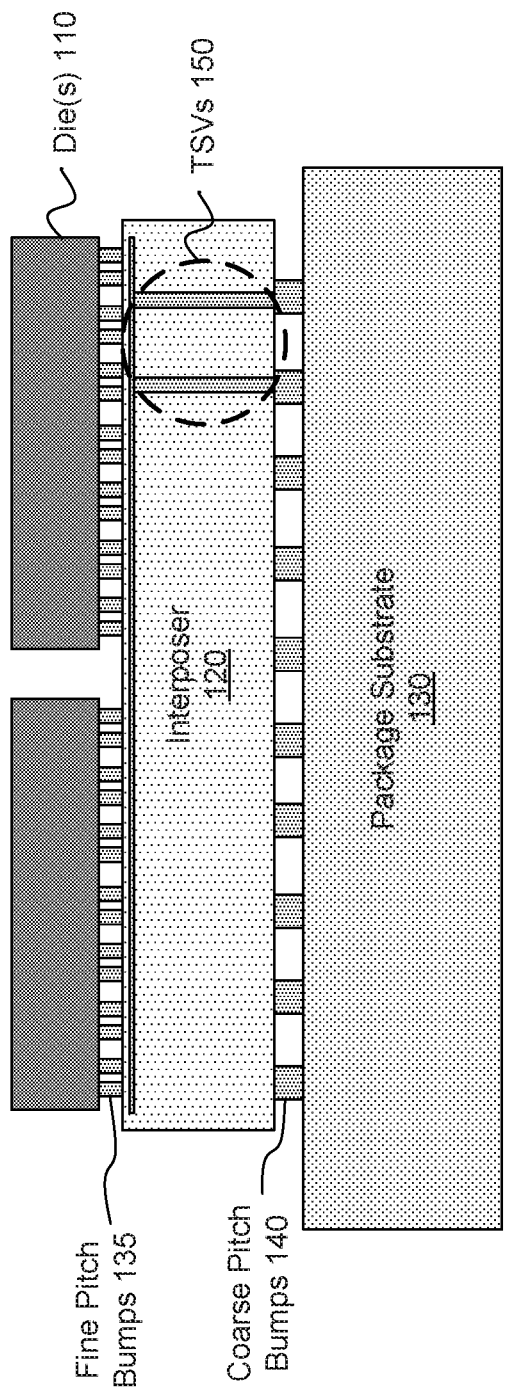
FIG. 1 illustrates a three dimensional (3D) stacking architecture in accordance with an example embodiment.

Reference will now be made to the exemplary embodiments illustrated, and specific language will be used herein to describe the same. It will nevertheless be understood that no limitation on technology scope is thereby intended.

DESCRIPTION OF EMBODIMENTS

Before the disclosed technology embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a bit line" includes a plurality of such bit lines.

Reference throughout this written description to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," "reduced," "minimized," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" items or objects are in physical contact and attached to one another. Objects described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

EXAMPLE EMBODIMENTS

An initial overview of technology embodiments is provided below and then specific embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

A three-dimensional (3D) integrated circuit (IC) is an integrated circuit that is manufactured by stacking silicon dies (or wafers) and interconnecting the silicon dies vertically using through-silicon vias (TSVs). These stacked silicon dies can behave as a single device, which can achieve performance improvements at reduced power as compared to conventional two-dimensional (2D) ICs. 3D ICs can exploit a z-direction to achieve various electrical performance benefits that were not possible with conventional 2D ICs. In upcoming years, 3D ICs are expected to have a broad impact in areas such as networking, graphics, mobile communications, consumer devices and computing. 3D ICs, as compared to conventional 2D ICs, can ease analog/digital integration challenges, increase interconnect speeds and bandwidth, reduce power constraints and enhance performance.

In one example, a 3D IC can utilize a multiple die packaging technology, in which multiple silicon dies are mounted on a package substrate. Silicon dies have been attached to a silicon-in-package (SiP) substrate using conventional technologies, such as a wire bond and/or a flip-chip, which can pose various performance, power and density challenges. A newer approach involves a silicon interposer substrate, which can provide finer die-to-die connections. For example, the silicon interposer substrate can include TSVs to provide connections from upper metal layers to backside metal layers within the silicon interposer substrate. The silicon interposer substrate can be positioned between the silicon dies and the package substrate, and can function to effectively connect the silicon dies to the package substrate. In other words, the silicon dies can be connected to the package substrate through the TSVs in the silicon interposer substrate between the silicon dies and the package substrate. This newer approach involving the silicon interposer substrate is sometimes referred to as 2.5D stacking.

In one configuration, the 3D IC can include one or multiple stacks of dies. Each stack of dies can include two or more dies that are connected together using TSVs. The stack(s) of dies can be connected to the silicon interposer substrate using fine pitch bumps (also referred to as micro bumps), which can have a pitch in the range of 10-80 (in some cases 20-30) micro meters (μm). The silicon interposer substrate can be connected to the package substrate using coarse pitch bumps (also referred to as flip-chip bumps), which can have a pitch in the range of 50-300 μm (in some cases 100 μm) depending on the application and/or process technology. In addition, the package substrate can be connected to a circuit board via package bumps.

FIG. 1 illustrates an exemplary three dimensional (3D) stacking architecture. The 3D stacking architecture can include dies 110 (or integrated circuits), an interposer 120 (e.g., a silicon interposer) and a package substrate 130. The dies 110 can include a stack of multiple dies. In one example, the dies 110 can be connected or coupled to the interposer 120 via a plurality of fine pitch bumps 135 (e.g., bumps having a pitch of 10 μm). The interposer 120 can be connected to the package substrate 130 via a plurality of coarse pitch bumps 140 (e.g., bumps having a pitch of 100 μm). The interposer 120 can have metal layers on both top and bottom sides of the interposer 120. The dies 110 can be bonded to the interposer 120 face-to-face (or face-to-back) at a finer pitch, and the interposer 120 can be assembled to the package substrate 130 at a coarser pitch. The dies 110 can be stacked together on top of the interposer 120, and the dies 110 can be connected to the package substrate 130 using a plurality of through-silicon vias (TSVs) 150 in the interposer 120. The TSVs 150 in the interposer 120 can enable signaling between the dies 110 and the package substrate 130. The TSVs 150 can be in pairs. For example, a TSV pair may include a signal TSV and a ground TSV. The TSV pair can also be referred to as a signal-ground TSV pair.

Figure 2:
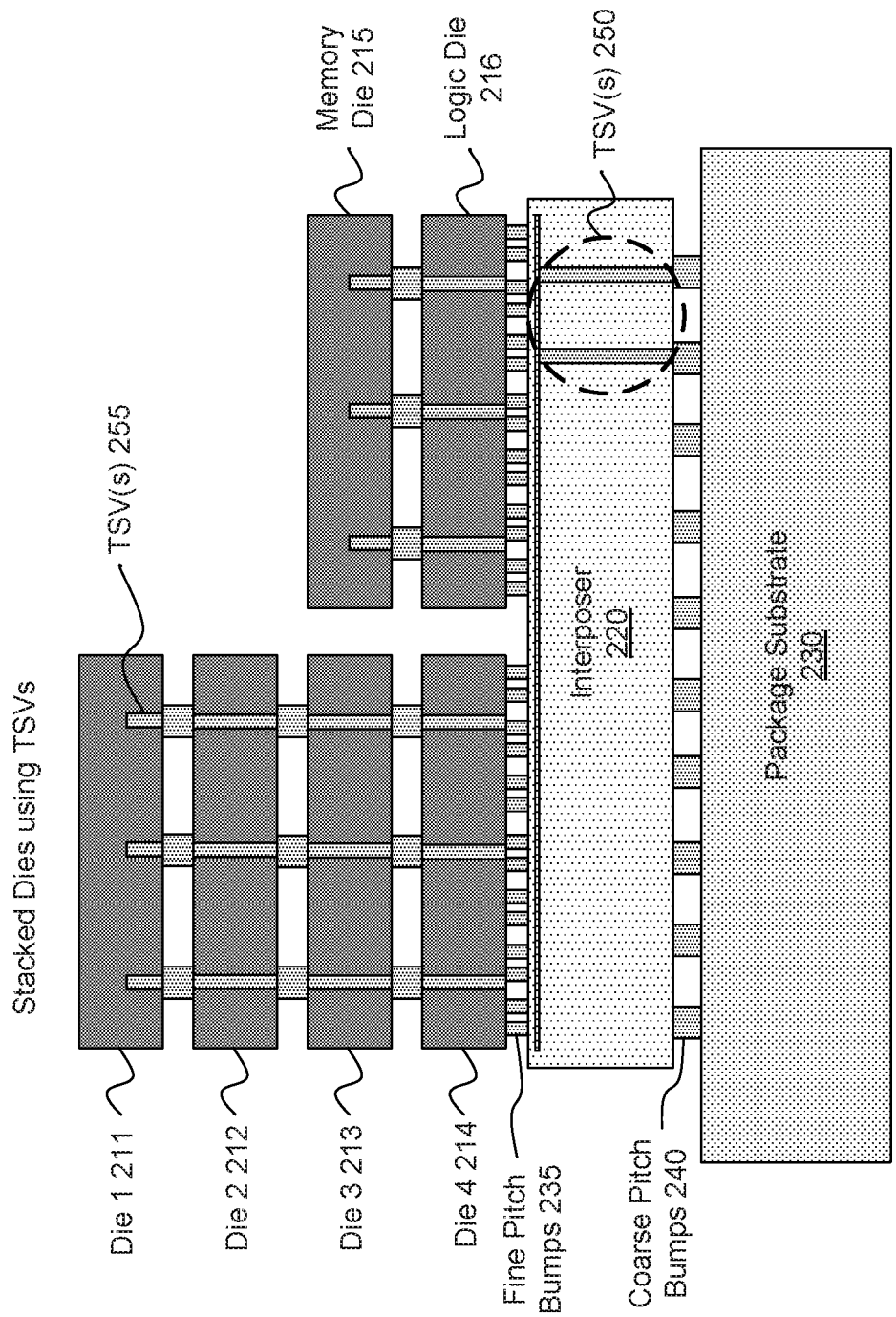
FIG. 2 illustrates another three dimensional (3D) stacking architecture in accordance with an example embodiment.

FIG. 2 illustrates an exemplary three dimensional (3D) stacking architecture. The 3D stacking architecture can include multiple stacks of dies (or integrated circuits), an interposer 220 (e.g., a silicon interposer) and a package substrate 230. The multiple stacks of dies can include a first stack of dies and a second stack of dies. The first stack of dies can include a first die (die 1) 211, a second die (die 2) 212, a third die (die 3) 213 and a fourth die (die 4) 214. The second stack of dies can include a memory die 215 and a logic die 216. Individual dies within a stack of dies can be connected together using a plurality of through-silicon vias (TSVs) 255. In one example, each stack of dies can be connected to the interposer 220 via a plurality of fine pitch bumps 235 (e.g., bumps having a pitch of 10 μm). The interposer 220 can be connected to the package substrate 230 via a plurality of coarse pitch bumps 240 (e.g., bumps having a pitch of 100 μm). The multiple stacks of dies can be bonded to the interposer 220 face-to-face at a finer pitch, and the interposer 220 can be assembled to the package substrate 230 at a coarser pitch. Each stack of dies on top of the interposer 220 can be connected to the package substrate 230 using a plurality of TSVs 250 in the interposer 220.

In one example, TSVs through an interposer can be used as an interconnection channel between dies and a package substrate. In other words, the TSVs in the interposer can be a medium for signals communicated between the dies and the package substrate. However, the TSVs can have an increased amount of signaling loss and crosstalk due to a presence of bulk silicon in the interposer as compared to a regular package substrate. This signaling loss can be due to the large capacitance of the thin isolation layer between the via and the bulk silicon and between the pad and the bulk silicon, as well as a leakage through the bulk silicon in the interposer. Both capacitance and leakage conductance can cause low pass effect to the signaling and thus limit the signaling bandwidth.

Figure 3:
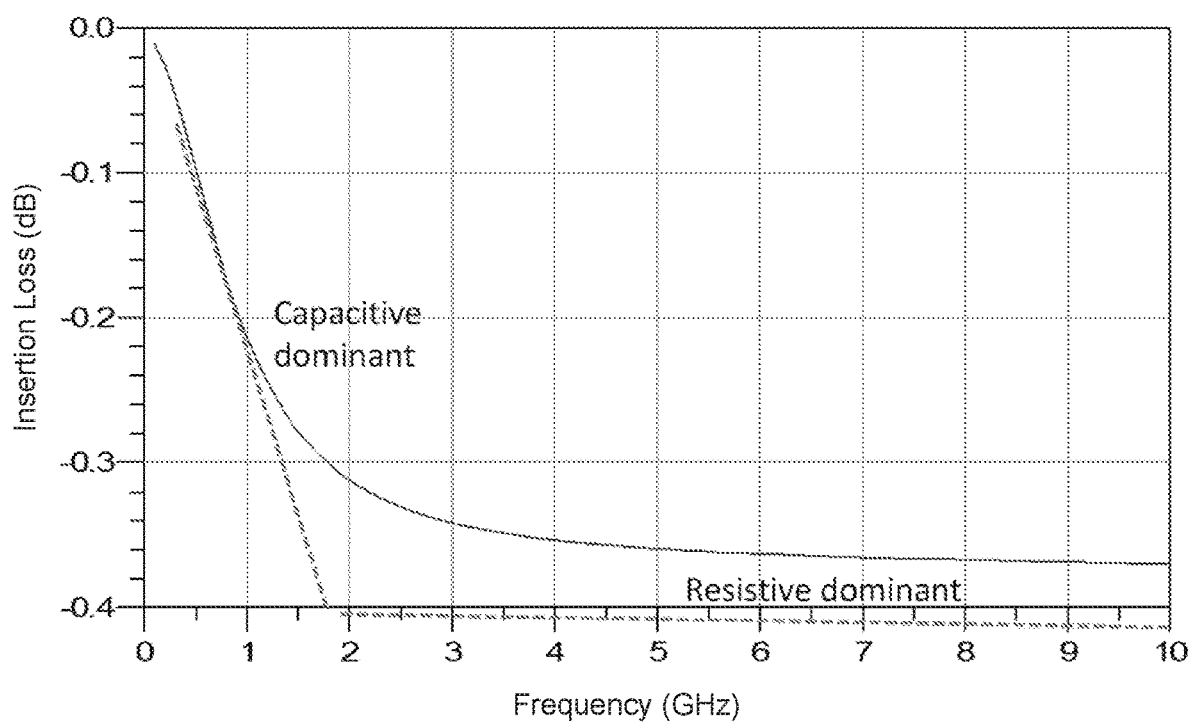
FIG. 3 illustrates an insertion loss of a through-silicon vias (TSV) pair in an interposer in accordance with an example embodiment.

FIG. 3 illustrates an example of insertion loss of a through-silicon vias (TSV) pair in an interposer (e.g., a silicon interposer). The insertion loss of the TSV pair (i.e., a signal-ground TSV pair) can refer to a signaling insertion loss, which can be measured in decibels (dB). The signaling insertion loss can indicate a loss of signal power. The insertion loss can vary depending on a frequency, which can be measured in gigahertz (GHz). Due to the conductive bulk silicon, the insertion loss for the TSV pair can exhibit a unique frequency-dependent behavior. As shown, the insertion loss with respect to approximately 0 GHz to 2 GHz can be associated with a capacitive dominant region, in which the isolation layer capacitance dominates the signaling behavior. The insertion loss with respect to approximately 2 GHz to 10 GHz can be associated a resistive dominant region, in which the leakage conductance of the bulk silicon starts to dominate the signaling behavior. During the resistive dominant region, the insertion loss of the TSV pair can be relatively stable. However, during the capacitive dominant region, the insertion loss of the TSV pair can exhibit an increased variation (e.g., approximately 0.4 dB), which can affect signaling performance, such as eye opening of a high-speed signaling channel. Eye opening is an important metric for signaling performance, and an increased amount of eye opening can correspond with improved signaling performance. In addition, for die stacking such as 3D memory stacking using TSVs, multiple pairs of vertical TSVs can be used and the TSV diameter is much smaller than that for interposer applications, in which an insertion loss variation can be even more significant.

As shown in FIG. 3, the insertion loss for the TSV pair can have a relatively large variation during the capacitive dominant region, which can adversely affect the signaling performance of a high-speed signaling channel. The variation or change in the insertion loss at different frequencies can be referred to as dispersion. In other words, an increased level of dispersion can indicate a larger insertion loss variation, which can adversely affect the signaling performance.

In the present technology, passive equalization can be utilized in a silicon substrate associated with the interposer, which can mitigate a TSV impact of large frequency-dependent insertion loss variation due to TSV capacitance. For example, the passive equalization can be achieved utilizing a combination of a resistor, an inductor and an Ohmic contact resistance to minimize the frequency-dependent insertion loss variation of the TSVs. In the present technology, the passive equalization can minimize or reduce insertion loss variation of the TSVs as compared to systems or devices that do not utilize passive equalization. In other words, based on the passive equalization achieved using the combination of the resistor, the inductor and the Ohmic contact region, the insertion loss variation of the TSVs can be minimized or reduced as compared to a system or device that does not utilize passive equalization with a passive equalizer as recited herein. The passive equalization can reduce the large dispersion in the capacitive dominant region of the TSV structure. In one example, the resistor can be a tunable resistor, which can be adaptively tuned to adjust the insertion loss variation for high-speed signaling circuits and channels. The tunable resistor can also compensate for process variations, which can affect the Ohmic contact resistance. Therefore, passive equalization using the combination of the resistor, the inductor and the Ohmic contact resistance can minimize the insertion loss variation or dispersion of the TSVs. In other words, the passive equalization using the resistor, the inductor and the Ohmic contact resistance can minimize a frequency-dependent signaling loss fluctuation or dispersion, and the passive equalization can be incorporated into existing 3D stacking processes.

In the present technology, passive equalization can be utilized to flatten the insertion loss or dispersion of the TSV pair shown in FIG. 3. For example, the passive equalization can flatten or minimize insertion loss variation or dispersion during the capacitive dominant region that ranges from approximately 0 GHz to 2 GHz. In FIG. 3, the insertion loss of the TSV pair can change by approximately 0.4 dB during the capacitive dominant region, but by using the passive equalization, the insertion loss variation of the TSV pair can be minimized during the capacitive dominant region (i.e., the insertion loss of the TSV pair can change by less than 0.4 dB during the capacitive dominant region). The passive equalization can be applied flexibly for tuning a signaling path for stacked die applications, such that the passive equalization can be applied to one or more stacked dies based on a signaling specification. In addition, the passive equalization can improve silicon interposer technology for high-speed signaling, and can be important for gaining a performance advantage of processors that use interposers and die stacking, such as 3D memory stacking using TSVs.

Previously, TSV performance was enhanced using thicker liner, shorter via and higher resistivity silicon. However, these enhancements were difficult for high volume manufacturing processes and would significant impact TSV yield. In addition, these enhancements did not resolve the large dispersion of insertion loss in the capacitive dominant region of TSV, in contrast to the passive equalization described in the present technology.

Figure 4:
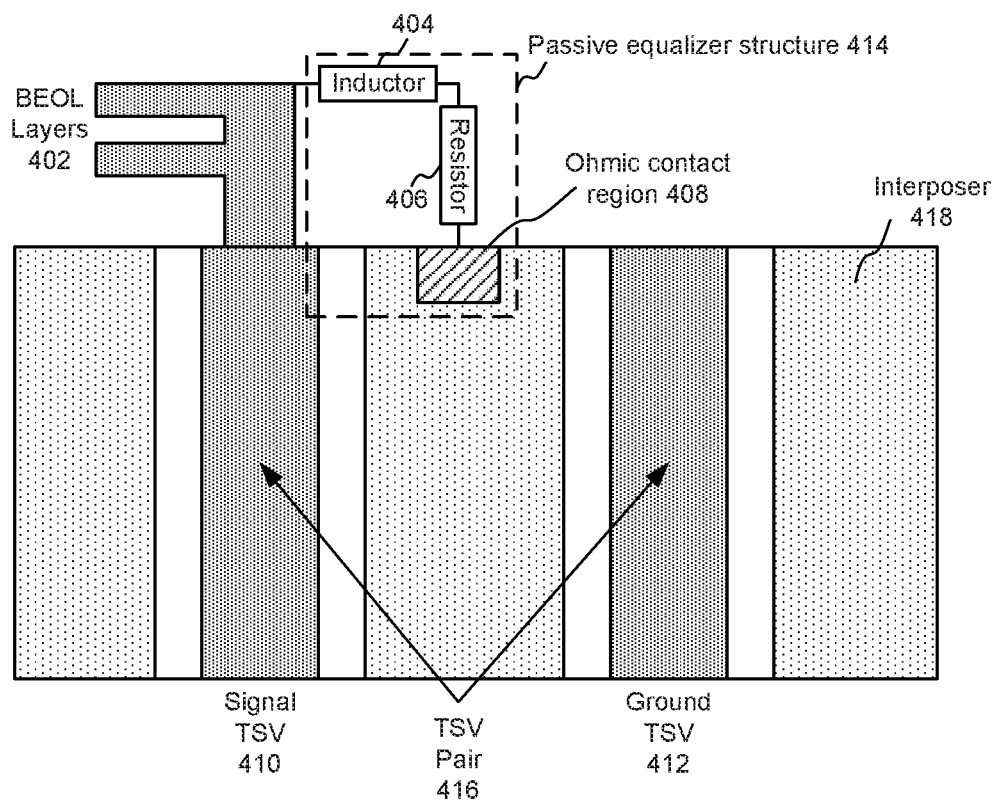
FIG. 4 illustrates a passive equalizer structure communicatively coupled to a through-silicon vias (TSV) pair in accordance with an example embodiment.

FIG. 4 illustrates an example of a passive equalizer structure 414 communicatively coupled to a through-silicon vias (TSV) pair 416. The TSV pair 416 can be included in one or more of a die (or stacked dies) or an interposer (See FIG. 2). The passive equalizer structure 414 can function to minimize an insertion loss variation for the TSV pair 416.

The TSV pair 416 can include a signal TSV 410 and a ground TSV 412. In other words, the TSV pair 416 can be a signal-ground TSV pair. The TSV pair 416 can be included in an interposer 418 (e.g., a silicon interposer), or alternatively, the TSV pair 416 can be included in stacked dies. The signal TSV 410 can be coupled to a back-end-of-line (BEOL) layer 402. In addition, the signal TSV 410 can be coupled to the passive equalizer structure 414, which can include an inductor 404 and a resistor 406 (e.g., a tunable resistor) and an Ohmic contact region 408. The inductor 404 and the resistor 406 can be coupled to the Ohmic contact region 408 that is formed in the interposer 418.

In an alternative configuration, the TSV pair 416 can be a differential TSV pair. In this case, each TSV in the differential TSV pair can have a separate equalizer structure. For example, a first TSV in the differential TSV pair can have a first equalizer structure (which includes a first inductor, a first resistor and a first Ohmic contact region), and a second TSV in the differential TSV pair can have a second equalizer structure (which includes a second inductor, a second resistor and a second Ohmic contact region).

In one configuration, the inductor 404, the resistor 406 and the Ohmic contact region 408 can be utilized to achieve passive equalization. For example, the resistor 406 and resistance in the Ohmic contact region 408 can introduce specific tunable loss at lower frequencies, while the inductor 404 can prevent signaling loss passing through at higher frequencies, which can serve to minimize the insertion loss variation for the TSV pair 416. The Ohmic contact region 408 can enable signaling loss flows to the interposer 418 at the lower frequencies. The grounded inductor 404 can behave like a high pass filter. The resistor 406 and resistance in the Ohmic contact region 408 can control a bandwidth of the high pass filter. Combining the high pass equalizer and the low pass TSV can achieve an all pass behavior, thus minimizing loss dispersion.

In one example, the inductor 404 and the resistor 406 can be connected to form a resistor-inductor circuit (RL circuit), which can act as a high pass filter to the signaling path through TSV. The inductor 404 and the resistor 406 can be connected to the signal TSV 410 in the TSV pair 416. The inductor 404 and the resistor 406 may not be directly part of a signal path formed by the TSV pair 416. Rather, the inductor 404 and the resistor 406 can be shunted to the signal path formed by the TSV pair 416. Signals at lower frequencies can have higher signaling loss due to the RL circuit, whereas signals at higher frequencies do not become affected by the RL circuit. In other words, the grounded RL circuit acting as the high pass filter can attenuate signals at the low frequencies while have very little impact at high frequencies. As a result, the inductor 404, the resistor 406 and the Ohmic contact region 408 can be effective in minimizing the insertion loss dispersion for the TSV pair 416.

In one example, the inductor 404 can also be tunable, depending on a specification of a high-speed channel. The inductor 404 can be built using the BEOL layers 402, which can be compatible with existing silicon fabrication processes. In one example, the inductor 404 can be a passive inductor that is formed using metal layers from die(s), the interposer 418, and package metal layers. Alternatively, the inductor 404 can be formed using a combination of complementary metal-oxide-semiconductor (CMOS) circuitries with metal structures to tune the performance. In addition, the resistor 406 can be achieved using CMOS circuitry, die or silicon interposer internal metal layers, or a combination thereof.

In one example, signals can pass through the inductor 404, the resistor 406 and the Ohmic contact region 408 on a top side of the interposer 418. Alternatively, the signals can pass through the inductor 404, the resistor 406 and the Ohmic contact region 408 on a bottom side of the interposer 418. In other words, since the interposer 418 can have routing metal layers on both a top and bottom side, the passive equalization can be realized on either the top side of the interposer 418 or the bottom side of the interposer 418.

In one configuration, the TSV pair 416 can be included in stacked dies. In other words, the stacked dies can be integrated together using TSVs. For stacked die applications, the stacked die can be communicatively coupled to each other using a plurality of TSVs. The stacked dies can be further coupled to a package substrate using a plurality of TSVs included in an interposer. As a result, the passive equalizer structure 414 can be communicatively coupled to the TSV pair 416 in the silicon substrate of the stacked dies and/or in the silicon interposer.

In one configuration, an electronic device package can be formed by: stacking one or more dies, connecting the one or more dies to the interposer 418 via a plurality of first TSVs, connecting the interposer 418 to the package substrate via a plurality of second TSVs, and connecting the passive equalizer structure 414 to the TSV pair 416 in one or more of the plurality of first TSVs or the plurality of second TSVs. The passive equalizer structure 414 can be formed to include the inductor 404, the tunable resistor 406, and the Ohmic contact region 408, wherein the inductor 404 and the tunable resistor 406 can be communicatively coupled to the Ohmic contact region 408. The Ohmic contact region 408 can be formed in the interposer 418 included in the electronic packaging device. In addition, the inductor 404 and the tunable resistor 406 can be formed in the passive equalizer structure 414 to be adjacent to a signal path formed by the TSV pair 416.

Figure 5:
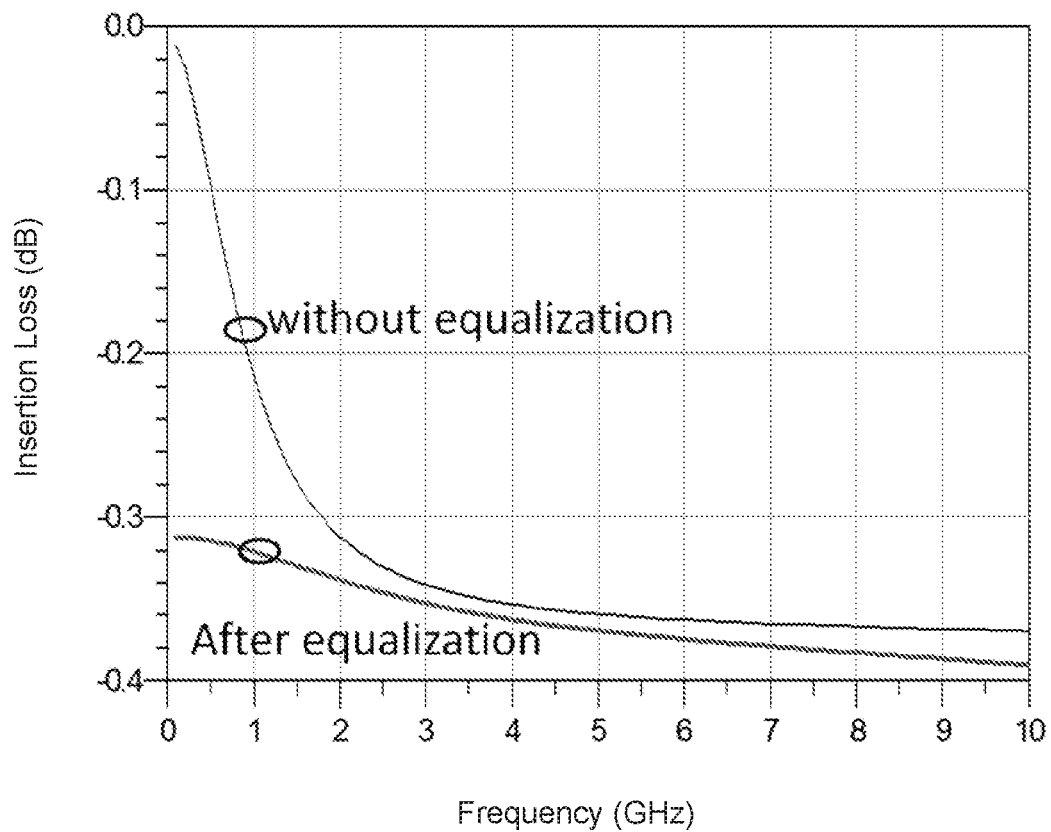
FIG. 5 illustrates an insertion loss of a through-silicon vias (TSV) pair without passive equalization versus without passive equalization in accordance with an example embodiment.

FIG. 5 illustrates an example of an insertion loss of a through-silicon vias (TSV) pair without passive equalization versus without passive equalization. As described earlier, passive equalization can utilize a combination of a tunable resistor, an inductor and an Ohmic contact resistance to minimize a frequency-dependent insertion loss variation of TSVs. In this example, a through-silicon vias (TSV) pair can be connected to a 50 ohm resistor, a 0.5 nano Henry (nH) inductor, and there can be an Ohmic contact resistance of 200 ohms. In this example, without passive equalization, the insertion loss (measured in dB) can dramatically drop from approximately 0 to approximately −0.4 as a frequency (measured in GHz) increases from 0 GHz to 10 GHz. In contrast, in this example, with passive equalization, the insertion loss can gradually drop from approximately −0.3 to approximately −0.4 as the frequency increases from 0 GHz to 10 GHz. Thus, with passive equalization, a frequency-dependent behavior of the insertion loss can be improved, thereby indicating that a capacitive dominant effect is compensated for the TSV pair. In other words, a presence of passive equalization can serve to minimize a level of insertion loss variation for the TSV pair as compared to an absence of passive equalization.

Figure 6:
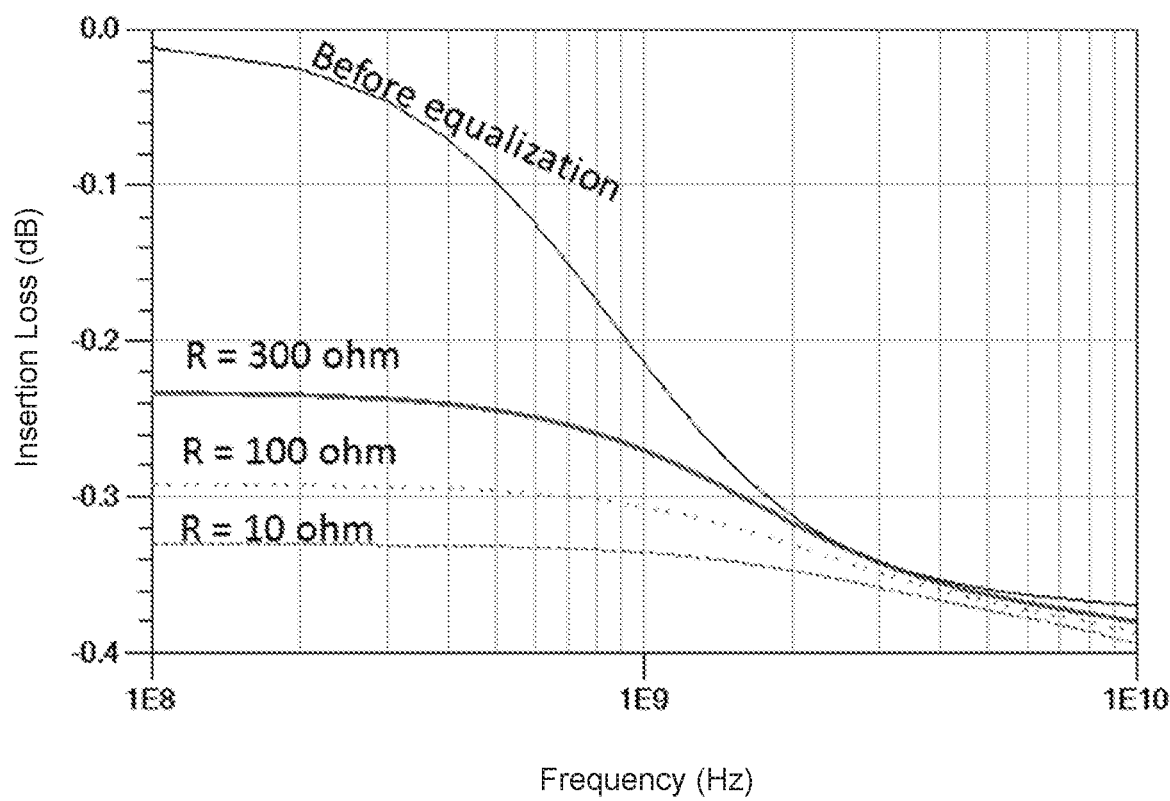
FIG. 6 illustrates an insertion loss of a through-silicon vias (TSV) pair for different levels of tunable resistance in accordance with an example embodiment.

FIG. 6 illustrates an example of an insertion loss of a through-silicon vias (TSV) pair for different levels of tunable resistance. By tuning a resistor and/or an inductor value, various levels of insertion loss variation reduction (or compensation) can be achieved for the TSV pair. For example, an amount of insertion loss variation can vary depending on whether the resistor is set to 300 ohms, 100 ohms or 10 ohms. In this example, the insertion loss variation can be greater when the tunable resistor is set to 300 ohms as opposed to 100 ohms, and the insertion loss variation can be greater when the tunable resistor is set to 100 ohms as opposed to 10 ohms. In addition, an ability to tune the resistor and/or the inductor value can be useful for adjusting a total high-speed channel performance due to process, design or other unknown variations.

FIG. 7 illustrates an exemplary system 700 operable to minimize an insertion loss. The system 700 can include a die 710. The system 700 can include an interposer 720. The system 700 can include a plurality of through-silicon vias (TSVs) 730. The system 700 can include a passive equalizer structure 740. The passive equalizer structure 740 can be communicatively coupled to a TSV pair in the plurality of TSVs 730. The passive equalizer structure 730 can be operable to minimize a level of insertion loss variation in the TSV pair.

FIG. 8 illustrates an exemplary electronic device package 800. The electronic device package 800 can include a die 810. The electronic device package 800 can include an interposer 820. The electronic device package 800 can include a package substrate 830. The electronic device package 800 can include a plurality of through-silicon vias (TSVs) 840 that are included in one or more of the die 810 or the interposer 820. The electronic device package 800 can include a passive equalizer structure 850. The passive equalizer structure 850 can be communicatively coupled to a TSV pair in the plurality of TSVs 840. The passive equalizer structure 850 can be operable to minimize a level of insertion loss variation in the TSV pair.

FIG. 9 depicts an exemplary flowchart of a method 900 for minimizing an insertion loss in an electronic device package. The method can include the operation of connecting a passive equalizer structure to a through-silicon vias (TSV) pair in the electronic packaging device, wherein the passive equalizer structure is operable to minimize a level of insertion loss variation in the TSV pair, as in block 910.

Figure 10:
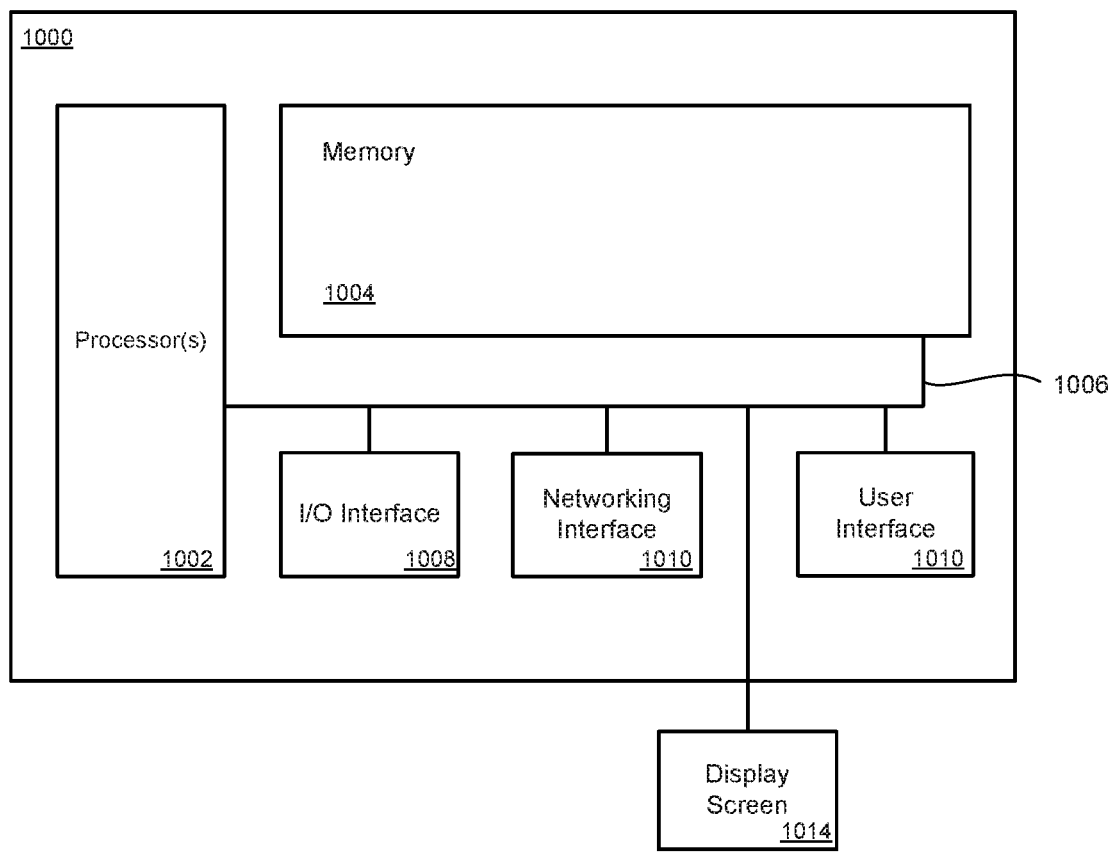
FIG. 10 illustrates a computing system that includes a data storage device in accordance with an example embodiment.

FIG. 10 illustrates a general computing system or device 1000 that can be employed in the present technology. The computing system 1000 can include a processor 1002 in communication with a memory 1004. The memory 1004 can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The computing system or device 1000 additionally includes a local communication interface 1006 for connectivity between the various components of the system. For example, the local communication interface 1006 can be a local data bus and/or any related address or control busses as may be desired.

The computing system or device 1000 can also include an I/O (input/output) interface 1008 for controlling the I/O functions of the system, as well as for I/O connectivity to devices outside of the computing system 1000. A network interface 1010 can also be included for network connectivity. The network interface 1010 can control network communications both within the system and outside of the system. The network interface can include a wired interface, a wireless interface, a Bluetooth interface, optical interface, and the like, including appropriate combinations thereof. Furthermore, the computing system 1000 can additionally include a user interface 1012, a display device 1014, as well as various other components that would be beneficial for such a system.

The processor 1002 can be a single or multiple processors, and the memory 1004 can be a single or multiple memories. The local communication interface 1006 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronic which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific technology embodiments and point out specific features, elements, or steps that can be used or otherwise combined in achieving such embodiments.

In one example, there is provided an electronic device package. The electronic device package can include one or more dies. The electronic device package can include an interposer coupled to the one or more dies. The electronic device package can include a package substrate coupled to the interposer. The electronic device package can include a plurality of through-silicon vias (TSVs) in at least one die of the one or more dies, or the interposer, or both. The electronic device package can include a passive equalizer structure communicatively coupled to a TSV pair in the plurality of TSVs, wherein the passive equalizer structure is operable to minimize a level of insertion loss variation in the TSV pair.

In one example of the electronic device package, the passive equalizer structure includes a tunable resistor, an inductor and an Ohmic contact region, wherein the tunable resistor and the inductor are communicatively coupled to the Ohmic contact region, said Ohmic contact region being formed adjacent to the TSV pair.

In one example of an electronic device package, the Ohmic contact region can be formed in either the die or in the interposer.

In one example of the electronic device package, the tunable resistor and the Ohmic contact region provide a tunable insertion loss at lower frequencies and the inductor prevents an insertion loss from passing through at higher frequencies, to minimize the level of insertion loss variation in the TSV pair.

In one example of the electronic device package, signals pass through the inductor prior to being passed through the tunable resistor.

In one example of the electronic device package, the tunable resistor and the inductor in the passive equalizer structure are adjacent to a signal path formed by the TSV pair.

In one example of the electronic device package, values for the tunable resistor and the inductor are adjusted to vary a reduction in the level of insertion loss variation in the TSV pair.

In one example of the electronic device package, the electronic device package can further include a second passive equalizer structure communicatively coupled to a second TSV pair in the plurality of TSVs, wherein the second TSV pair is included in the die in the one or more dies or the interposer.

In one example of the electronic device package, the passive equalizer structure is communicatively coupled to the TSV pair via a back-end-of-line (BEOL) layer.

In one example of the electronic device package, the TSV pair is a signal-ground TSV pair or a differential TSV pair, wherein a separate passive equalizer structure is coupled to each TSV in the differential TSV pair.

In one example of the electronic device package, the passive equalizer structure is operable to minimize a level of frequency-dependent insertion loss variation in the TSV pair due to a TSV capacitance.

In one example of the electronic device package, the die is communicatively coupled to the interposer via a plurality of fine pitch bumps; and the interposer is communicatively coupled to the package substrate via a plurality of coarse pitch bumps.

In one example of the electronic device package, the one or more dies are included in a die stack.

In one example of the electronic device package, the electronic device package is a three-dimensional integrated circuit with a stacked architecture.

In one example of the electronic device package, the TSV is in the interposer and communicatively couples a first die in the one or more dies to the substrate.

In one example of the electronic device package, the TSV is in a first die of the one or more dies and communicatively couples a second die to the interposer.

In one example of the electronic device package, the interposer includes a TSV communicatively coupling a first die to the substrate, and the first die includes a TSV communicatively coupling a second die to the interposer.

In one example of the electronic device package, the second die includes a TSV communicatively coupling a third die to either the first die, or to the interposer.

In one example of the electronic device package, a passive equalizer structure is communicatively coupled to each TSV pair in the electronic device package.

In one example, there is provided a computing system. The computing system can include a motherboard. The computing system can include an electronic device package coupled to the motherboard.

In one example of the computing system, the computing system comprises a desktop computer, a laptop, a tablet, a smartphone, a wearable device, a server, or a combination thereof.

In one example of the computing system, the computing system further comprises a processor, a memory device, a heat sink, a radio, a slot, a port, or a combination thereof operably coupled to the motherboard.

In one example, there is provided an electronic component. The electronic component can include a silicon layer. The electronic component can include a through-silicon vias (TSV) included in the silicon layer. The electronic component can include a passive equalizer structure communicatively coupled to the TSV, wherein the passive equalizer structure is operable to minimize a level of insertion loss variation in the TSV.

In one example of the electronic component, the silicon layer is a die, and the TSV is included in the die.

In one example of the electronic component, the silicon layer is an interposer, and the TSV is included in the interposer.

In one example of the electronic component, the passive equalizer structure includes a tunable resistor, an inductor and an Ohmic contact region, wherein the tunable resistor and the inductor are communicatively coupled to the Ohmic contact region.

In one example of the electronic component, the tunable resistor and the Ohmic contact region provide a tunable insertion loss at lower frequencies and the inductor prevents an insertion loss from passing through at higher frequencies, to minimize the level of insertion loss variation in the TSV.

In one example of the electronic component, signals pass through the inductor prior to being passed through the tunable resistor.

In one example of the electronic component, the tunable resistor and the inductor in the passive equalizer structure are adjacent to a signal path formed by the TSV.

In one example of the electronic component, values for the tunable resistor and the inductor are adjusted to vary a reduction in the level of insertion loss variation in the TSV In one example of the electronic component, the passive equalizer structure is communicatively coupled to the TSV via a back-end-of-line (BEOL) layer.

In one example, there is provided a method for making an electronic device package. The method can include stacking a plurality of dies, wherein the plurality of dies includes a first die and a second die. The method can include connecting the second die in the plurality of dies to an interposer via a plurality of first through-silicon vias (TSVs). The method can include connecting the interposer to a package substrate via a plurality of second TSVs. The method can include connecting a passive equalizer structure to a TSV pair in one or more of the plurality of first TSVs or the plurality of second TSVs.

In one example of the method for making an electronic device package, the method can further include forming the passive equalizer structure to include a tunable resistor, an inductor and an Ohmic contact region, wherein the tunable resistor and the inductor are communicatively coupled to the Ohmic contact region, said Ohmic contact region being formed adjacent to the TSV pair in the electronic device package.

In one example of the method for making an electronic device package, the method can further include forming the tunable resistor and the inductor in the passive equalizer structure to be adjacent to a signal path formed by the TSV pair.

In one example, there is provided a method for minimizing an insertion loss in an electronic device package. The method can include connecting a passive equalizer structure to a through-silicon vias (TSV) pair in the electronic device package, wherein the passive equalizer structure is operable to minimize a level of insertion loss variation in the TSV pair.

In one example of the method for minimizing an insertion loss in an electronic device package, the method can further include forming the passive equalizer structure to include a tunable resistor, an inductor and an Ohmic contact region, wherein the tunable resistor and the inductor are communicatively coupled to the Ohmic contact region, said Ohmic contact region being formed adjacent the TSV pair in the electronic device package.

In one example of the method for minimizing an insertion loss in an electronic device package, the method can further include: providing, via the tunable resistor and the Ohmic contact region, a tunable insertion loss at lower frequencies; and preventing, via the inductor, an insertion loss from passing through at higher frequencies, to minimize the level of insertion loss variation in the TSV pair.

In one example of the method for minimizing an insertion loss in an electronic device package, the method can further include passing signals through the inductor prior to passing signals through the tunable resistor.

In one example of the method for minimizing an insertion loss in an electronic device package, the method can further include forming the tunable resistor and the inductor in the passive equalizer structure to be adjacent to a signal path formed by the TSV pair.

In one example of the method for minimizing an insertion loss in an electronic device package, the method can further include adjusting values for the tunable resistor and the inductor to vary a reduction in the level of insertion loss variation in the TSV pair.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. An electronic device package, comprising:
   one or more dies;
   an interposer coupled to the one or more dies;
   a package substrate coupled to the interposer;
   a plurality of through-silicon vias (TSVs) in at least one die of the one or more dies, or the interposer, or both; and
   a passive equalizer structure communicatively coupled to a TSV pair in the plurality of TSVs, wherein the passive equalizer structure is operable to minimize a level of insertion loss variation in the TSV pair, wherein the passive equalizer structure includes a tunable resistor, an inductor and an Ohmic contact region, wherein the tunable resistor and the inductor are communicatively coupled to the Ohmic contact region, said Ohmic contact region being formed adjacent to the TSV pair.

2. The electronic device package of claim 1, wherein the tunable resistor and the Ohmic contact region provide a tunable insertion loss at lower frequencies and the inductor prevents an insertion loss from passing through at higher frequencies, to minimize the level of insertion loss variation in the TSV pair.

3. The electronic device package of claim 1, wherein signals pass through the inductor prior to being passed through the tunable resistor.

4. The electronic device package of claim 1, wherein the tunable resistor and the inductor in the passive equalizer structure are adjacent to a signal path formed by the TSV pair.

5. The electronic device package of claim 1, wherein values for the tunable resistor and the inductor are adjusted to vary a reduction in the level of insertion loss variation in the TSV pair.

6. The electronic device package of claim 1, further comprising a second passive equalizer structure communicatively coupled to a second TSV pair in the plurality of TSVs, wherein the second TSV pair is included in the die of the one or more dies or in the interposer.

7. The electronic device package of claim 1, wherein the passive equalizer structure is communicatively coupled to the TSV pair via a back-end-of-line (BEOL) layer.

8. The electronic device package of claim 1, wherein the TSV pair is a signal-ground TSV pair or a differential TSV pair, wherein a separate passive equalizer structure is coupled to each TSV in the differential TSV pair.

9. The electronic device package of claim 1, wherein the passive equalizer structure is operable to minimize a level of frequency-dependent insertion loss variation in the TSV pair due to a TSV capacitance.

10. The electronic device package of claim 1, wherein:
the die is communicatively coupled to the interposer via a plurality of fine pitch bumps; and
the interposer is communicatively coupled to the package substrate via a plurality of coarse pitch bumps.

11. The electronic device package of claim 1, wherein the one or more dies are included in a die stack.

12. The electronic device package of claim 1, wherein the electronic device package is a three-dimensional integrated circuit with a stacked architecture.

13. The electronic device package of claim 1, wherein the TSV is in the interposer and communicatively couples a first die in the one or more dies to the substrate.

14. The electronic device package of claim 1, wherein the TSV is in a first die of the one or more dies and communicatively couples a second die to the interposer.

15. The electronic device package of claim 1, wherein the interposer includes a TSV communicatively coupling a first die to the substrate, and the first die includes a TSV communicatively coupling a second die to the interposer.

16. The electronic device package of claim 15, wherein the second die includes a TSV communicatively coupling a third die to either the first die, or to the interposer.

17. The electronic device package of claim 16, wherein a passive equalizer structure is communicatively coupled to each TSV pair in the electronic device package.

18. An electronic component, comprising:
a silicon layer;
a through-silicon vias (TSV) included in the silicon layer; and
a passive equalizer structure communicatively coupled to the TSV, wherein the passive equalizer structure is operable to minimize a level of insertion loss variation in the TSV, wherein the passive equalizer structure includes a tunable resistor, an inductor and an Ohmic contact region, wherein the tunable resistor and the inductor are communicatively coupled to the Ohmic contact region.

19. The electronic component of claim 18, wherein the silicon layer is a die, and the TSV is included in the die.

20. The electronic component of claim 18, wherein the silicon layer is an interposer, and the TSV is included in the interposer.

21. The electronic component of claim 18, wherein the tunable resistor and the Ohmic contact region provide a tunable insertion loss at lower frequencies and the inductor prevents an insertion loss from passing through at higher frequencies, to minimize the level of insertion loss variation in the TSV.

22. The electronic component of claim 18, wherein signals pass through the inductor prior to being passed through the tunable resistor.

23. The electronic component of claim 18, wherein the tunable resistor and the inductor in the passive equalizer structure are adjacent to a signal path formed by the TSV.

24. The electronic component of claim 18, wherein values for the tunable resistor and the inductor are adjusted to vary a reduction in the level of insertion loss variation in the TSV.

25. The electronic component of claim 18, wherein the passive equalizer structure is communicatively coupled to the TSV via a back-end-of-line (BEOL) layer.

26. A method for making an electronic device package, the method comprising:
stacking a plurality of dies, wherein the plurality of dies includes a first die and a second die;
connecting the second die in the plurality of dies to an interposer via a plurality of first through-silicon vias (TSVs);
connecting the interposer to a package substrate via a plurality of second TSVs; and
connecting a passive equalizer structure to a TSV pair in one or more of the plurality of first TSVs or the plurality of second TSVs, the passive equalizer comprising a tunable resistor, an inductor and an Ohmic contact region, wherein the tunable resistor and the inductor are communicatively coupled to the Ohmic contact region, said Ohmic contact region being formed adjacent to the TSV pair in the electronic device package.

27. The method of claim 26, further comprising forming the tunable resistor and the inductor in the passive equalizer structure to be adjacent to a signal path formed by the TSV pair.

* * * * *